United States Patent [19]

Lewis

[11] Patent Number: 4,499,658
[45] Date of Patent: Feb. 19, 1985

[54] SOLAR CELL LAMINATES

[75] Inventor: Kathrine J. Lewis, Canoga Park, Calif.

[73] Assignee: Atlantic Richfield Company, Los Angeles, Calif.

[21] Appl. No.: 529,456

[22] Filed: Sep. 6, 1983

[51] Int. Cl.³ .............. H01L 31/18; H01L 21/56; C09J 5/06
[52] U.S. Cl. .............. 29/588; 29/572; 136/251; 156/327
[58] Field of Search .............. 156/307.1, 327, 332; 29/572, 588; 136/251

[56] References Cited

U.S. PATENT DOCUMENTS 4,371,739  2/1983  Lewis et al. .............. 136/251
4,461,922  7/1984  Gay et al. .............. 136/249

OTHER PUBLICATIONS

A. DeSombre et al., "Laminated Modules With New Plastic Material Based on an Ethylene-Vinylacetate Copolymer", Proceedings, 4th E.C. Photovoltaic Solar Energy Conf., Stresa, Italy, May 1982, Reidel Pub. Co. (1982), pp. 377–381.

Primary Examiner—Aaron Weisstuch
Attorney, Agent, or Firm—Roderick W. MacDonald

[57] ABSTRACT

A method for forming photovoltaic cell module laminates wherein the cells are sealed in a crosslinked polymer between a solid superstrate and a solid substrate wherein the polymer is formed from ethylene/vinylacetate copolymer having dispersed therein at least one peroxide initiator to crosslink the polymer and at least one organosilane primer to promote bonding of the ethylene/vinylacetate to the superstrate and substrate, the initiator being present in an amount of no more than 1 weight percent based on the total weight of the copolymer and the primer being present in an amount of no more than 0.5 weight percent based on the total weight of the copolymer and subjecting the thus formed laminate to an elevated temperature for a time sufficient to crosslink the copolymer and seal the photovoltaic cells in the crosslinked copolymer while at the same time binding the crosslinked ethylene/vinylacetate copolymer to both the substrate and superstrate.

9 Claims, 1 Drawing Figure

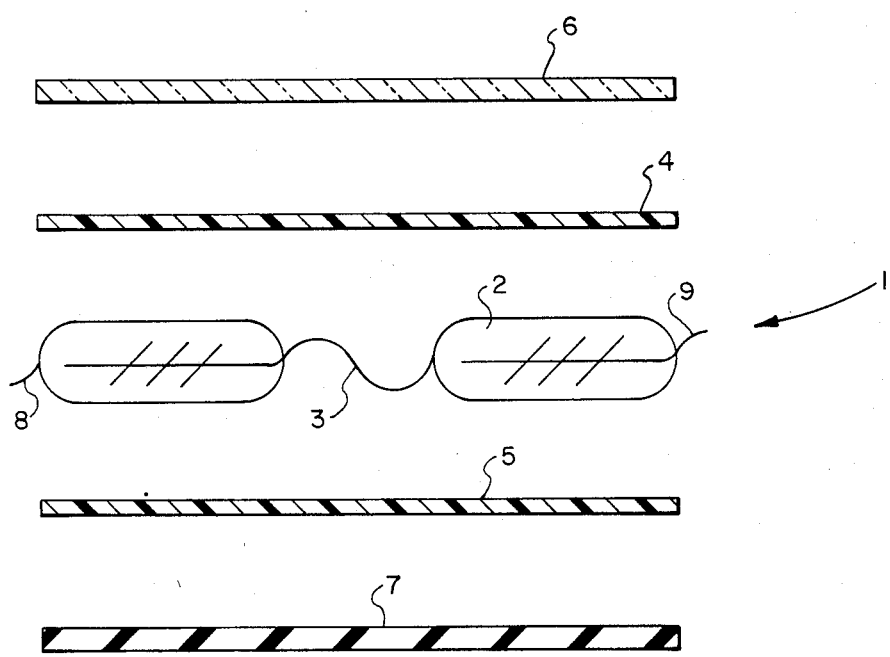

SOLAR CELL LAMINATES

BACKGROUND OF THE INVENTION

Heretofore, it has been suggested that polymers formed from polyvinyl butyral or ethylene/vinylacetates be used to encapsulate photovoltaic cells in solar module laminates. It has also been suggested that various primers be sprayed on the cell circuit, transparent superstrate, and electrically insulating substrate that go into making these laminates prior to crosslinking the polymer in order to form bonds between the resulting crosslinked polymer and the cell circuit, substrate, and superstrate in the finally formed laminate. Further, it is desirable, but has been difficult to achieve, a practical crosslinking rate for the formation of these laminates. For example, common, but unpractical, crosslinking or cure rates require up to an hour or more of heating at an elevated temperature with or without elevated or reduced pressure to achieve crosslinking and bonding of the laminate to the extent desired. Further, it has been difficult to achieve a practical cure rate with minimum formation of gaseous products generated by the materials present in the laminate during heating to cause crosslinking.

BRIEF SUMMARY OF THE INVENTION

In accordance with this invention, there has been found a particular combination of crosslinking (polymerization) initiator and monomeric primer which when used in certain carefully controlled amounts can be employed in intimate mixture with the polymer to be crosslinked thereby eliminating the step of separately spraying the cell circuit, substrate, and superstrate with primer to promote bonding during crosslinking while at the same time achieving a practical cure rate of no more than one-half hour with minimum gas formation during the crosslinking or curing step.

Thus, in accordance with this invention, ethylene vinylacetate is employed as the copolymer which has intimately mixed or dispersed therein at least one peroxide initiator and at least one monomeric organosilane primer, the initiator being present in an amount of no more than 1 weight percent based on the total weight of the ethylene/vinylacetate copolymer and the monomeric primer being present in an amount of no more than 0.5 weight percent based on the total weight of the copolymer. When this copolymer and monomeric primer mixture is placed over the top and bottom of photovoltaic cells to be formed into a laminate and the desired cell circuit substrate and superstrate placed adajcent to this mixture and the entire assembly subjected to an elevated temperature for a time sufficient to crosslink the ethylene/vinylacetate copolymer and simultaneously bond the monomeric primer to its backbone, a resulting laminate is achieved with a cure rate requiring no more than 30 minutes heating for crosslinking and bonding purposes. There is thus obtained a laminate composed of photovoltaic cells completely encapsulated in a crosslinked ethylene/vinylacetate copolymer with the polyethylene/vinylacetate being securely bonded to the cell circuit and to the substrate and superstrate desired for the laminate with minimum gas bubbles present in the polyethylene/vinylacetate.

Accordingly, it is an object of this invention to provide a new and improved method for forming photovoltaic cell module laminates.

It is another object to provide a method for making photovoltaic cell module laminates using a cure time which is short enough to be practical with minimum gas formation during curing and which will bond the laminate together without a separate primer application step.

Other aspects, objects, and advantages of this invention will be apparent to those skilled in the art from this disclosure and the appended claims.

BRIEF DESCRIPTION OF THE DRAWING

The drawing shows a cross-sectional exploded view of a typical photovoltaic cell module laminate which can be formed in accordance with the method of this invention.

DETAILED DESCRIPTION OF THE INVENTION

The drawing shows the separate elements of a standard photovoltaic cell module laminate which are to be bound into a single integral laminate which is strong and weather resistant for placement out of doors to receive solar radiation and to convert at least a portion of same to usable electrical energy. The core of the laminate is the photovoltaic cell assembly 1 which is composed of a plurality of photovoltaic cells 2 interconnected by wires 3 to conduct electricity from cell to cell and ultimately out of the laminate for recovery and use as desired. Adjacent the upper side of cell assembly 1, is placed a layer of polymer 4, often referred to in the art as pottant, which is placed against the upper side of cell assembly 1, a similar layer of polymer 5 is placed against the lower side of cell assembly 1. A transparent superstrate such as glass 6 is placed against upper pottant 4 while an insulating substrate 7 is placed against lower pottant layer 5. As desired, substrate 7 can be composed just of an electrical insulating material or an insulator and a metal or other rigid material for laminate strengthening purposes, but a single insulating layer 7 is shown in the drawing for sake of simplicity. In a normal process of assembling the elements of the drawing into a single laminate and then forming that laminate into a unitary rigid product sufficiently weather resistant and protective of cell assembly 1 to be placed for an indefinite time in all sorts of weather, both sides of cell assembly 1 and one side each of superstrate 6 and substrate 7 are normally sprayed with a primer on the side that is adjacent pottant layers 4 and 5, thereby increasing the strength of the bond between the pottant and the circuit, superstrate, and substrate. Further, in a conventional laminate forming process, the pottant employed is a polymer which can be crosslinked or cured by subjecting same to an elevated temperature with or without an elevated or reduced pressure to that once the laminate is assembled, the assembly is heated for the required crosslinking or cure time after which pottants 4 and 5 flow together to form a single unitary polymer layer which totally encapsulates cell assembly 1 except for wires 8 and 9 which extend out of the polymer so the electricity can be recovered from the module and the crosslinked material encasing cell assembly 1 is also strongly bonded to that assembly 1 and to superstrate 6 and substrate 7 thereby providing the desired unitary strong weatherproof photovoltaic cell module laminate.

In accordance with this invention, no primer is separately sprayed on cell assembly 1, superstrate 6 or substrate 7. Rather, the polymer employed is ethylene/vinylacetate copolymer and intimately mixed or otherwise dispersed in the ethylene/vinylacetate copolymer is at least one peroxide initiator and at least one monomeric organosilane primer, the initiator being present in an amount of no more than 1 weight percent based on the total weight of the ethylene/vinylacetate copolymer present and the primer being present in an amount of no more than 0.5 weight percent based on the total weight of the ethylene/vinylacetate copolymer present. This composition would be employed for both pottant 4 and pottant 5 of the drawing.

The laminate shown in the drawing with the pottant being composed of polyethylene/vinylacetate as just described above, is then subjected to an elevated temperature, with or without an elevated or reduced pressure, for a time sufficient to crosslink the ethylene/vinylacetate copolymer and fuse the crosslinked polymer layers 4 and 5 to one another thereby completely encapsulating cell assembly 1 in crosslinked ethylene/vinylacetate while at the same time bonding the crosslinked ethylene/vinylacetate to superstrate 6 and substrate 7, all of this being accomplished without separately spraying cell assembly 1, superstrate 6 and substrate 7 with primer, but with a cure or crosslinking rate which is practical for commercial purposes, i.e., not more than 30 minutes, with or without elevated or reduced pressure, and with minimum formation of gas in the pottant during the heating step to cause crosslinking of the ethylene/vinylacetate.

It has been found that by using olefin/vinylacetate copolymers, particularly ethylene/vinylacetate in combination with peroxide initiators, particularly tertiary butyl peroxide type initiators, and polymerizable organosilane primers, particularly methacrylorganosilane, more particularly methacryloxypropyltrimethoxy silane, and by using no more than the amounts specified above for the initiator and primer, the advantages set forth hereinabove as to cure rate and outgassing are achieved while still forming a strongly bonded laminate.

Of course, the pottant material used in this invention can include other additives routinely incorporated in pottant materials for photovoltaic cell laminates such as ultra violet absorbers, antioxidants, and the like.

In forming the laminate of this invention, the assembled parts as set forth in the drawing are placed in contact with one another under reduced and then ambient pressure and heated for up to 30 minutes to a temperature of from about 140° to about 160° C. It is during this heating step that causes crosslinking or curing that gas formation, such as the formation of vapors of silane primer hydrolysis and peroxide decomposition products can occur, particularly in hot spots in the laminate, and which can if they occur to a substantial extent, cause voids or bubbles which affect the ability of light to pass through superstrate 6 and pottant 4 and reach cell assembly 1 for conversion of the photons in that light to usable electricity to be recovered by way of wires 8 and 9. Voids can also crack cells and allow electrical shorting to occur. To help minimize outgassing even more, it is preferable that this heating step be carried out in the range of from about 150° to about 155° C. This heating step can be carried out under ambient pressure, if desired, or under elevated (or reduced) pressure from zero up to about two atmospheres during at least part of the heating step.

The amount of peroxide initiator preferably is from about 0.5 to about 1 weight percent based upon the total weight of the ethylene/vinylacetate copolymer present.

EXAMPLE

Several ethylene/vinylacetate copolymer formulations each containing varying amounts of initiator and primer were made up and tested in a commercially available Brabender-Cycloviscograph. The Cycloviscograph is composed of 2 spaced apart (15 mils) heated platens, the lower platen being driven and the upper platen being spring biased toward the lower platen, so that as the formulation in the 15 mil gap crosslinks, its increased viscosity can be measured in terms of torque (cm·g) and how long it takes to achieve a desired torque value that represents a state of crosslinking that would be employed for commercial photovoltaic cell module laminates. In the runs of this example, a torque of 500 cm·g was used, for comparison purposes, representing just over about 50% cure. The time period required to reach that torque value while heating the formulation in the gap at about 150° C. and ambient pressure was recorded. This gave an indication of the curing rate for the formulation and whether the formulation had a potential for commercial application.

In Run 1, the ethylene/vinylacetate, hereinafter "EVA", copolymer had intimately mixed therein using conventional high shear mixing equipment at ambient temperature and pressure 0.5 weight percent 0,0-t-butyl-0-(2-ethyl hexyl)monoperoxycarbonate, hereinafter "TBEC", initiator and 0.5 weight percent g-methacryloxypropyltrimethoxysilane, hereinafter "174", primer, all weight percents in this Example being based on the total weight of the EVA polymer present.

In Run 2, the EVA formulation had mixed therein 0.5 weight percent 2,5-dimethyl-2,5-di-(t-butylperoxy)hexane, hereinafter "101", initiator and 0.5 weight percent 174 primer.

In Run 3, the EVA formulation had mixed therein 0.75 weight percent TBEC and 0.5 weight percent 174.

In Run 4, the EVA formulation had mixed therein 0.75 weight percent 101 and 0.5 weight percent 174.

In Run 5, the EVA formulation had mixed therein 0.5 weight percent TBEC and 1.0 weight percent 174.

In Run 6, the EVA formulation had mixed therein 0.5 weight percent 101 and 1.0 weight percent 174.

In Run 7, the EVA formulation had mixed therein 0.75 weight percent TBEC and 1.0 weight percent 174.

In Run 8, the EVA formulation had mixed therein 0.75 weight percent 101 and 1.0 weight percent 174.

The cure time test results and calculated outgassing potential for Runs 1 through 4 are as follows:

| Run | Wt. % of Initiator | Wt. % of Primer | Time (minutes) to Reach 500 cm · g Torque | Total cc's Vapor Formation per 100 gram Polymer |
| --- | --- | --- | --- | --- |
| 1 | 0.5–TBEC | 0.5 | 3.8 | 180 |
| 2 | 0.5–101 | 0.5 | 18.8 | 212 |
| 3 | 0.75–TBEC | 0.5 | 2.9 | 203 |
| 4 | 0.75–101 | 0.5 | 12.7 | 251 |

For Runs 5 through 8 with the amounts of initiator again at 0.5 and 0.75 weight percents, but with the primer increased from the 0.5 weight percent of Runs 1 through 4 to 1.0 weight percent, the cure times increased dramatically as follows:

| Run | Wt. % of Initiator | Wt. % of Primer | Time (minutes) to Reach 500 cm · g Torque | Total cc's Vapor Formation per 100 gram Polymer |
|---|---|---|---|---|
| 5 | 0.5-TBEC | 1.0 | 12.0 | 316 |
| 6 | 0.5-101 | 1.0 | 35.0 | 348 |
| 7 | 0.75-TBEC | 1.0 | 5.8 | 339 |
| 8 | 0.75-101 | 1.0 | 31.0 | 387 |

In addition to causing dramatic increases in cure time, the additional primer doubled the potential for bubble formation, without adding significantly to bond strengths at the pottant to circuit, substrate, or superstrate interfaces. The bubbles come from outgassing of volatile, low molecular weight alcohol, ketone and/or organic acid by-products of the hydrolysis of silane primer and the decomposition of peroxide crosslinking agent.

Adding more peroxide to reincrease the cure rate as in Runs 7 and 8, further raised the outgassing potential and still did not lower the cure time for 101 to a practical level.

This thus establishes that for practical cure times with economical amounts of initiator and primer when using a peroxide initiator and silane primer, the initiator should not exceed 1 weight percent and the primer should not exceed 0.5 weight percent.

In Runs 1 through 4, the amount of gas formation experienced during heating was controllable and was acceptable for a commercial photovoltaic module laminate. If significantly larger amounts of initiator and/or primer were to be used, for example to obtain shorter cure periods, gas formation becomes a substantially greater problem.

Reasonable variations and modifications are possible within the scope of this disclosure without departing from the spirit and scope of this invention.

I claim:

1. In a method for forming a photovoltaic cell module laminate composed of at least one photovoltaic cell circuit sealed in a polymer, a solid superstrate, bonded to said polymer on the upperside of said cell and a solid substrate bonded to said polymer on the bottom side of said cell circuit, the improvement comprising providing upper and lower layers of uncrosslinked ethylene/vinylacetate copolymer adjacent the top and bottom of said cell circuit, said ethylene/vinylacetate copolymer layers having dispersed therein at least one peroxide initiator to crosslink said ethylene/vinylacetate copolymer and at least one organosilane monomer primer to promote bonding of said ethylene/vinylacetate copolymer to said cell circuit, superstrate and substrate, said initiator being present in an amount of no more than 1 weight percent based on the total weight of said ethylene/vinylacetate copolymer, said primer being present in an amount of no more than 0.5 weight percent based on the total weight of said ethylene/vinylacetate copolymer, and subjecting said laminate to an elevated temperature for a time sufficient to crosslink said ethylene/vinylacetate copolymer and seal said crosslinked ethylene/vinylacetate copolymer layers to one another around said cells thereby completely encapsulating said cells in crosslinked ethylene/vinylacetate copolymer and bonding said crosslinked ethylene/vinylacetate copolymer to said cell circuit, substrate and superstrate without separately coating said cell circuit, substrate and superstrate with primer prior to said crosslinking and bonding step.

2. The method of claim 1 wherein said primer is methacrylorganosilane.

3. The method of claim 2 wherein said primer is methacryloxypropyltrimethoxysilane.

4. The method of claim 3 wherein said initiator is tertiary butyl peroxide.

5. The method of claim 4 wherein said initiator is 2,5-dimethyl-2,5-di-(t-butylperoxy)hexane.

6. The method of claim 4 wherein said initiator is 0,0-t-butyl-0-(2-ethyl hexyl)monoperoxycarbonate.

7. The method of claim 2 wherein said elevated temperature is from about 140° to about 160° C., and said time for heating is not more than 30 minutes.

8. The method of claim 2 wherein said initiator is tertiary butyl peroxide.

9. The method of claim 1 wherein said ethylene/vinylacetate copolymer layers also contain ultra violet light stabilizers and antioxidant agents to improve the long term stability of the crosslinked ethylene/vinylacetate.

* * * * *